HEARING AID TRANSISTOR AMPLIFIER

Filed April 13, 1956

INVENTOR.
FRANK A. HERRMANN
BY Greene, Pineles & Durr
ATTORNEYS

United States Patent Office 2,927,276
Patented Mar. 1, 1960

2,927,276

HEARING AID TRANSISTOR AMPLIFIER

Frank A. Herrmann, White Plains, N.Y., assignor to Sonotone Corporation, Elmsford, N.Y., a corporation of New York Application April 13, 1956, Serial No. 578,129
4 Claims. (Cl. 330—22)

This invention relates to amplifiers, and particularly to hearing aid transistor amplifiers of the type used in tiny, compact, miniature hearing aid amplifier units worn inconspicuously on the body of the user, although features of the invention have application also in other transistor amplifiers.

Among the objects of the invention is a miniature transistor amplifier requiring a considerably smaller number of circuit components than in known prior hearing-aid transistor amplifiers, and which operate with high efficiency and stability over a wide range of variations in the characteristics of the transistors and other components due to temperature changes.

Figure 2:
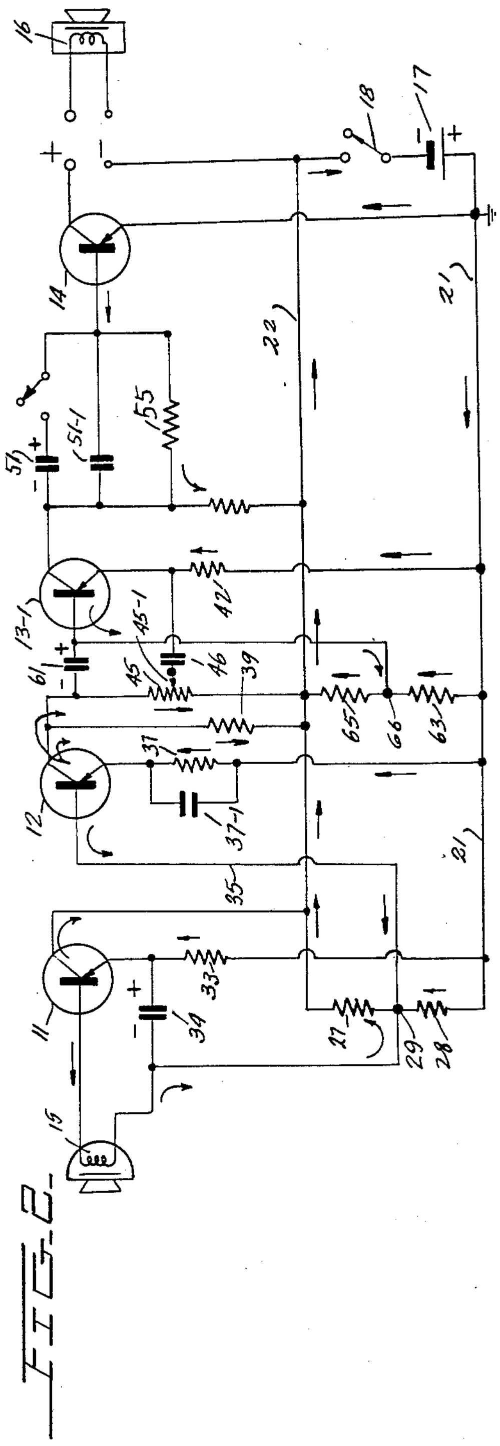
Figure 1:
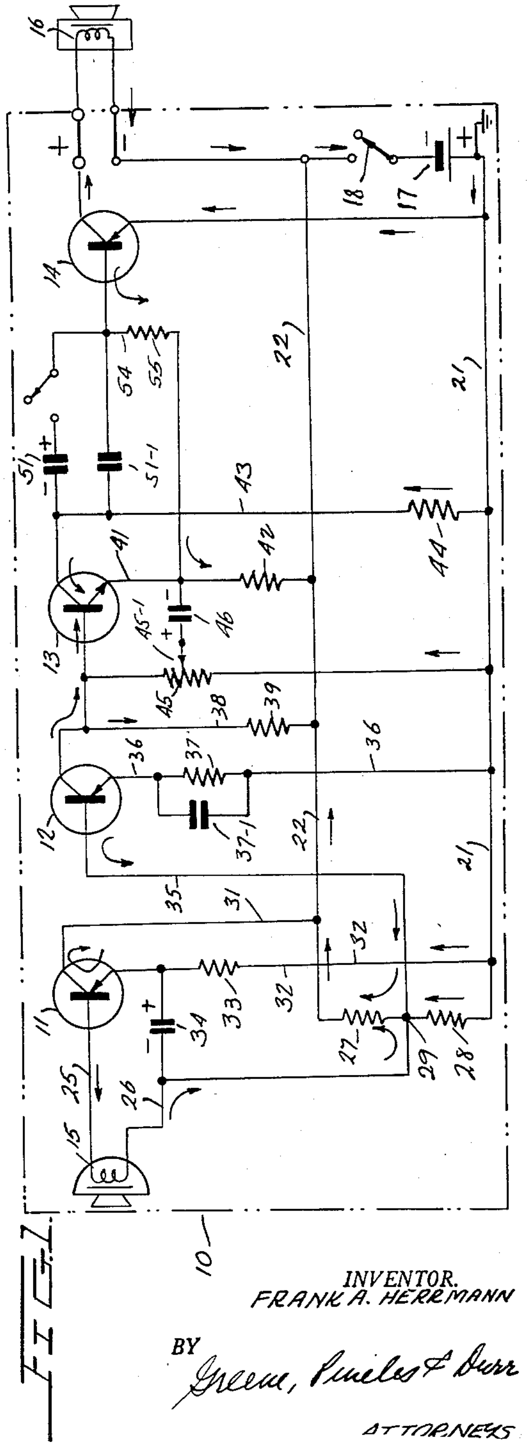

The foregoing and other objects of the invention will be best understood from the following description of exemplifications thereof, reference being had to the accompanying drawings, wherein:

Fig. 1 is a circuit diagram of one practical form of a miniature hearing aid amplifier exemplifying the invention; and Fig. 2 is a similar circuit diagram of another exemplification of the invention.

In any transistor amplifier circuit, it is essential to limit the emitter and collector currents so that the voltage difference from the emitter to the collector shall not be less than the minimum value required for effective amplification. When the energy supply voltage is limited, such as in cases when the energy supply voltage is only that corresponding to one or two battery cells, too much current will result in a voltage drop in the resistance of the emitter-collector circuit which will be sufficient to reduce the net voltage between the emitter and the collector to below such minimum value. An increase in the transistor temperature, particularly in the case of transistor circuits operating with a common emitter configuration, is accompanied by a large increase in emitter current unless the bias of the transistor is controlled to minimize such undesirable current increase due to temperature.

In miniature transistor hearing aid amplifiers, the individual transistors, resistances, capacitors and other circuit components must be compressed into an extremely small volume. All these components must be of the minutest possible size, and they must operate with high stability and relatively long useful service life under severe operating conditions on the body of the user over a wide range of temperature and humidity conditions. The present invention makes it possible to reduce the number of the miniature components required to provide a highly efficient miniature transistor hearing-aid amplifier having at least two successive transistor amplifier stages operating with a common emitter configuration which are biased to minimize undesirable increase in emitter current and will operate with the desired over-all frequency response. It also simplifies the amplifier circuits, and thereby simplifies the control of the critical factors which determine the reliability and stability of its operation over wide variations of temperature and humidity while worn on the body of the user.

Fig. 1 shows the circuit diagram of one form of tiny miniature hearing-aid amplifier of the invention occupying a volume of only 1.5 cubic inches. The hearing-aid amplifier shown has four successive transistor amplifier stages operating with transistors 11, 12, 13 and 14, for amplifying the output of a hearing-aid microphone 15 and delivering it to a receiver 16. All elements of the amplifier are housed in the miniature amplifier casing indicated by dash-double-dot line 10, except for the receiver 16, which may be either a miniature earphone worn hidden in the ear of the user, or a miniature bone receiver worn hidden in contact with a hearing-inducing bone of the user. The circuits of all four transistor amplifier stages are energized from the same power supply source 17 shown in the form of a single battery cell, the two poles of which are connected through an on-and-off switch 18 to two supply leads 21, 22 of opposite polarity. To simplify the description, supply lead 21 which corresponds to what is known as a ground conductor or lead, will be designated as the low-potential lead, and the other supply lead 22, as the high-potential lead. It should be noted that amplifiers of the invention may be readily designed to operate with power supplies of much higher voltages, such as used in other applications.

In the amplifier of Fig. 1, each of the transistors 11, 12, 13 and 14 is connected for operation with a common emitter configuration. In accordance with accepted practice, the term "common emitter configuration" of a transistor circuit, means that the input is impressed on the base and emitter, and that the output is delivered by the collector and emitter of the transistor. The microphone 15 is of the electromagnetic type, and sound generates in its coil winding a signal current which is delivered through leads 25, 26 to the base and the emitter of transistor 11 of the first amplifier stage. Direct-current biasing for transistor 11 and also some of the other transistors, is provided by voltage-dividing resistors or bias resistance elements 27, 28 which are connected across the energy supply leads 21, 22, and have an intermediate resistor portion or resistor connection 29 to which lead 26 from the winding of the microphone 15 is connected for supplying therethrough the proper bias current to the base of transistor 11. The collector of transistor 11 is directly connected through lead 31 to the higher-potential supply lead 22. The emitter of transistor 11 is connected through lead 32 having connected therein a load resistance 33 to the lower-potential supply line 21, thereby completing the biasing and operating connections of the transistor 11, the operation of which will be explained hereinafter. The signal input circuit from microphone winding 15 to the base and emitter of transistor 11 is completed by by-pass capacitor 34. This capacitor 34 also permits the application of direct-current bias to the base while providing a low impedance signal path to the emitter of transistor 11. The output signal current of transistor 11 flows from its collector through collector lead 31, supply lead 22, switch 18, battery 17, supply lead 21, back through emitter lead 32 and load resistance 33 to the emitter, the output being developed across load resistance 33.

In accordance with a phase of the invention disclosed herein, the biasing circuit elements including the voltage-dividing resistance elements 27, 28 of transistor 11 of this amplifier stage are so designed and arranged as to also provide at the same intermediate resistor portion or connection 29, a common direct-current biasing connection not only for the base of transistor 11, but also for the base of the next transistor 12 of the next transistor stage, through the direct-current lead 35 thereto, through which also the signal output developed across load resistance 33 of transistor 11 is delivered through capacitor 34 to the base of the next transistor 12.

The emitter of transistor 12 of the second amplifier stage is connected through an emitter lead 36, which includes resistance 37, to the low-potential supply lead 21, the resistance 37 in the emitter lead being by-passed by capacitor 37–1. The collector of transistor 12 is connected through collector lead 38 which includes a load resistance 39 to the high-potential supply lead 22, thereby completeing the output circuit as well as the biasing circuit connections of transistor 12 of the second amplifying stage.

In order to make it possible for the circuit arrangement shown to provide a common biasing connection from the voltage-dividing resistance elements 27, 28 of the supply to both the base of transistor 11 and the base of the next transistor 12 of the next amplifier stage—which common biasing connection also delivers the output of the preceding transistor 11 to the base of the next transistor 12—the emitter of the first transisor has to be connected to its supply lead 21 by load resistance 33 which provides nearly the same voltage drop as the resistance 37 through which the emitter of the next transistor is connected to supply lead 21. Such common biasing connection—for the bases of two succeeding transistors, each having a common emitter connection—may be used when the emitter currents in the two transistors are nearly equal. When it is desired to make the emitter current in one of the transistors higher than in the other transistor, for instance, to have the emitter current in transistor 12 higher than in transistor 11, the resistance 37 in the emitter lead of transistor 12 is made smaller than the resistance 33 in the emitter lead of transistor 11, so that the voltage drop across resistance 37 is about equal to the voltage drop across resistance 33, and vice versa.

Thus, in accordance with the invention, two successive transistor amplifier stages operating with a common emitter configuration—and having the emitter of each transistor connected to the energy supply through resistance elements which provide substantially the same voltage drop—have their bases biased by a common connection to an intermediate portion of the bias resistance elements connected across the energy supply so that the output of the preceding amplifier stage is developed across the resistance in the emitter lead of the preceding transistor at said common connection, and is impressed therethrough together with the proper bias on the base of the next transistor.

The above-described circuit arrangement of the combination of two successive transistor amplifier stages has the great advantage in that it eliminates the need for an additional coupling capacitor between the output circuit of the preceding transistor and the base of the suceeding transistor, and the need for additional voltage-dividing bias resistances for the succeeding transistor. In the so simplified two-transistor circuit, capacitor 34 causes the alternating-current signal potential which appears at the emitter of the preceding transistor 11, to appear also at the bias-applying intermediate resistance portion or connection 29 of the bias resistance elements 27, 28, in that the alternating-current signal output of preceding transistor 11 is delivered through capacitor 34 and the common biasing connection 29 of bias resistances 27, 28 to the base of the next transistor 12.

In the circuit arrangement described above, the combination of the load resistance 33 in the emitter lead of transistor 11 with the biasing connections provided by the voltage-dividing resistance elements 27, 28 for the base of transistor 11, also provides automatic control of the emitter current in transistor 11. Thus a tendency of the direct current through the emitter to increase, for instance due to temperature, produces an increased voltage drop across load resistance 33, which in turn decreases the voltage difference between the base and emitter, and results in a corresponding decrease of the bias current to the base of transistor 11, thereby minimizing the increase of current that would otherwise occur. In a similar way, the automatic bias control of the emitter current of the next transistor 12 is secured by the similar cooperative relationship of the combination of the resistance 37 in the lead from its emitter with the biasing connections provided by common bias connection 29 of the voltage-dividing bias resistance elements 27, 28 to the base of transistor 12. Thus a tendency for the direct current in the emitter of transistor 12 to increase, produces an increased voltage drop across emitter lead resistance 37, which in turn decreases the voltage difference between its base and emitter, thereby minimizing the increase in the emitter current of transistor 12 that would otherwise occur. In this amplifier stage, the emitter biasing resistance 37 is by-passed for signal current by the by-pass capacitor 37–1.

In accordance with a phase of the invention disclosed herein, the next amplifier stage operates with a transistor 13 having movable electric charge carriers or charges of a polarity opposite to the polarity of the movable charge carriers of the preceding transistor 12; and its base is connected through a direct-current connection to the collector of the preceding transistor 12 for receiving therefrom the signal output developed at the load resistance 39 in the collector lead of the preceding transistor 12, while the emitter of said next stage transistor 13 is connected through a signal by-passing capacitor 46 to the output side of the preceding transistor 12. Thus, by way of example, in the circuit arrangement shown, the transistors 11, 12 and 14 of the first, second and last amplification stage are all of one type, such as PNP transistors, and transistor 13, which is next to transistor 12, is an NPN transistor. Alternatively, transistors 11, 12 and 14 may all be NPN transistors, and transistor 13 a PNP transistor. This circuit arrangement of the invention thus eliminates the need of a direct-current blocking capacitor for coupling the collector of the preceding transistor 12 to the base of the next transistor 13, which base operates at the same direct-current potential as the collector of the preceding transistor 12. The emitter of transistor 13 is connected through a lead 41 including a biasing resistance 42 to the higher-potential supply lead 22, and its collector is connected through a collector lead 43 including a load resistance 44, to the other low-potential supply lead 21, for developing the output across load resistance 44. When replacing the transistor shown with transistors having a movable charge of opposite polarity, the polarity of the energy supply 17 and of the electrolytic capacitors 39, 37–1, 46 and 51 should be reversed.

In accordance with a phase of the invention disclosed herein, the volume control of the amplifier is provided not by a variable resistance connected in series with a current-carrying circuit, but by a variable tap of a volume-control resistance 45 connected between the base of transistor 13 and a supply lead thereof. The movable tap connection 45–1 of the volume control resistance is connected through signal by-pass capacitor 46 to the emitter of transistor 13, so that an adjustable amount of the output developed across load resistance 39 of transistor 12 is supplied to the emitter and base of transistor 13. This volume control arrangement is effectively parallel to the collector load resistance of transistor 12, which thus acts as the source of the signal current for the next transistor 13. All capacitors, including capacitor 46 of the amplifier of Fig. 1, are of the electrolytic type and are connected with the appropriate polarity, indicated by their (+) and (−) signs. The load resistance 39 is connected between the collector of transistor 12 and the higher-potential supply lead 22, while the volume control resistance 45 is connected between the collector of this transistor 12 and the other supply lead 21 so as to prevent a reversal of the D.C. voltage impressed on the capacitor at an intermediate setting of the volume control resistance 45.

With the above-described arrangement, when the volume-control tap 45–1 is in the maximum-volume position and provides a direct connection to the supply lead 21, capacitor 46 by-passes the emitter resistance 42 of transistor 13, and its degenerative action is suppressed. In the other extreme position of the movable volume-control tap 45–1, by-pass capacitor 46 acts as a short circuit for signal currents between the base and the emitter of transistor 13. When the movable volume-control tap 45–1 is moved from the maximum-volume position to lower-volume positions, it reduces the signal by-passing action of capacitor 46 across the emitter lead resistance 42, gradually increasing its degenerative action, and in addition capacitor 46 starts to by-pass the signals impressed between the base and emitter of transistor 13 until, in the minimum-volume position, capacitor 46 provides a short circuit for signals between the base and the emitter of transistor 13.

Transistor 13 is provided with proper automatic bias control by the voltage-dividing resistance network of the preceding transistor 12 consisting of emitter resistor 37, the effective internal direct-current resistance between the collector and emitter, and the collector load resistance 39 of the preceding transistor 12. The connection of the base of transistor 13 to an intermediate portion of this voltage-dividing network—at the collector of the preceding transistor 12—together with the resistance 42 in the emitter lead of transistor 13, provide automatic bias control in the same manner as explained above in connection with the bias control of transistors 11, 12. Thus an increase in the emitter current of transistor 13, due to temperature, for instance, increases the voltage drop across emitter resistance 42, thereby decreasing the voltage difference between its emitter and base, thus minimizing the increase of emitter current that would otherwise occur.

The amplified signal developed by the transistor 13 across its collector load resistance 44 is delivered to the base of the last amplifier stage transistor 14 through one or both parallel-connected coupling capacitors 51, 51–1, a cut-out switch 52 making it possible to cut out one of the capacitors so as to reduce the low-frequency response in accordance with the requirements of the hard-of-hearing person using it.

In accordance with a phase of the invention disclosed herein, automatic bias control for a transistor of a multi-transistor amplifier is secured by taking advantage of the fact that all amplifier transistors are housed in the same compact casing, and are subjected to substantially equal temperature changes which will cause all their emitter currents to increase with increase in temperature. In accordance with the invention, the bias applied to the electrodes of transistor 14 is automatically controlled by the increase of current in a preceding transistor due to temperature change, for modifying the bias applied to the succeeding transistor 14 so as to minimize the change of current that would otherwise occur. To this end, in the particular amplifier of Fig. 1, the base of transistor 14 is connected through lead 54, which includes the resistance 55, to the junction between the emitter of transistor 13 and resistance 42 through which this emitter is connected to the energy supply. The tendency of the emitter current of transistor 14 to increase due to temperature will be accompanied by a similar increase of the emitter current of transistor 13, which will produce an increased voltage drop across resistance 42 in the emitter lead of transistor 13. The increased voltage drop across bias resistance 42 of transistor 13 reduces the voltage available for biasing the base of transistor 14 through lead 54 and its resistance 55, thereby minimizing the increase of emitter current of transistor 14 that would otherwise occur due to increase of temperature.

The emitter is connected to the low-potential supply lead 21, and the collector is connected through the receiver winding 16 to the opposite polarity supply lead 22.

Without thereby limiting the scope of the invention, but in order to enable more ready practice thereof, there are given below, design data of one practical form of an amplifier of the invention of the type described in connection with Fig. 1.

*Resistors*

| Resistor | Kilo-Ohms |
|---|---|
| 27 | 10 |
| 28 | 5.6 |
| 33 | 1.5 |
| 37 | 1.5 |
| 39 | 1.5 |
| 42 | 1.2 |
| 44 | 1.5 |
| 45 | 7.5 |
| 54 | 10 to 100 |

*Capacitors*

| Capacitor | Microfarads | Type | Voltage Rating |
|---|---|---|---|
| 34 | 4 | Electrolytic | 4 |
| 37–1 | 16 | do | 1 |
| 46 | 16 | do | 1 |
| 51 | 1 | do | 4 |
| 51–1 | .03 | Ceramic | ---------- |

The value of resistance 54 is chosen to match transistor 14. The winding of microphone 15 has at 1000 c.p.s., an impedance of 5000 ohms, and a direct-current resistance of 1500 ohms. The winding of receiver 16 has at 1000 c.p.s., an impedance of 550 ohms, and a direct-current resistance of 220 ohms.

In cases where only one type of transistor, for instance only PNP transistors or only NPN transistors are available for use in amplifiers of the type described above, transistor 12 of the second amplifier stage has to be connected to the same type of transistor as the next amplifying stage through a coupling capacitor. Fig. 2 shows such modified form of hearing-aid amplifier of the invention, consisting of the same combination of elements except for the modifications described below. The third transistor amplifier stage operates with the same type of transistor 13–1 as the three other transistors 11, 12 and 14 of this amplifier. The output developed across the load resistance 39 of the preceding transistor 12 is delivered to the base of the next transistor 13–1 through a coupling capacitor 61. The same type of volume control 45 with a movable contact tap 45–1 is connected through a coupling capacitor 46 to the emitter of transistor 13–1. The base of transmitter 13–1 is supplied with the proper bias by connecting across the supply leads 21, 22 another set of bias resistance elements 63, 64, having an intermediate resistance portion or connection 66 to which the base of transistor 13–1 is connected. Otherwise, the amplifier of Fig. 2 is identical with the amplifier of Fig. 1.

The features and principles underlying the invention described above in connection with specific exemplifications will suggest to those skilled in the art many other modifications thereof. It is accordingly desired that the appended claims shall not be limited to any specific feature or details thereof.

I claim:

1. In an amplifier for a device, such as a hearing aid worn on the body of the user, having a plurality of amplifier stages energized by an energy supply having two supply poles such as a battery, one amplifier stage having one transistor for amplifying signals of a signal source and a next amplifier stage having a next transistor connected to the output side of said one transistor for further amplifying said signals, a base, emitter and collector of each of said transistors having a direct-current connection to said supply poles and the circuits of each of said transistors having a common emitter configuration with both emitters connected to one supply pole and both collectors connected to the other supply pole, a bias resistance element connected between said two supply poles, an intermediate portion of said bias resistance element being connected to the base of each of said transistors to apply a common bias to each of said bases, an emitter resistance connected between the emitter of each of said transistors and its said one supply pole, a capacitance connecting the output of said one amplifier stage from the emitter of said one transistor to the input of said next amplifier stage at the base of its next transistor, circuit means for impressing through said capacitance a signal input between the base and emitter of said one transistor with one terminal of the circuit means being connected to the base of said one transistor and the other terminal thereof to the resistance intermediate portion, said bias resistance element and said emitter resistances being proportioned to cause an increase in the direct current through the emitter of either one of said transistors to reduce the bias applied through said resistance intermediate portion to its respective base and thereby minimize said current increase.

2. In an amplifier for a device, such as a hearing aid worn on the body of the user, having a plurality of amplifier stages energized by an energy supply having two supply poles such as a battery, one amplifier stage having one transistor for amplifying signals of a signal source and a next amplifier stage having a next transistor connected to the output side of said one transistor for further amplifying said signals, a base, emitter and collector of each of said transistors having a direct-current connection to said supply poles and the circuits of each of said transistors having a common emitter configuration with both emitters connected to one supply pole and both collectors connected to the other supply pole, a bias resistance element connected between said two supply poles, an intermediate portion of said bias resistance element being connected to the base of each of said transistors to apply a common bias to each of said bases, an emitter resistance connected between the emitter of each of said transistors and its said one supply pole, each of said emitter resistances being proportioned to cause the emitter currents of said two transistors to develop substantially the same voltage drop across said two emitter resistance, a capacitance connecting the output of said one amplifier stage from the emitter of said one transistor to the input of said next amplifier stage at the base of its next transistor, circuit means for impressing through said capacitance a signal input between the base and emitter of said one transistor with one terminal of the circuit means being connected to the base of said one transistor and the other terminal thereof to the resistance intermediate portion, said bias resistance element and said emitter resistances being proportioned to cause an increase in the direct current through the emitter of either one of said transistors to reduce the bias applied through said resistance intermediate portion to its respective base and thereby minimize said current increase.

3. In an amplifier as claimed in claim 2, each of said emitter resistances being of substantially the same value.

4. In an amplifier for a device, such as a hearing aid worn on the body of the user, having a plurality of amplifier stages energized by an energy supply having two supply poles such as a battery, one amplifier stage having one transistor for amplifying signals of a signal source and a next amplifier stage having a next transistor connected to the output side of said one transistor for further amplifying said signals, a base, emitter and collector of each of said transistors having a direct-current connection to said supply poles and the circuits of each of said transistors having a common emitter configuration with each collector being connected to the supply pole opposite that to which its associated emitter is connected, said two transistors being housed in a compact casing relatively close to each other so that changes in the temperature of one transistor are accompanied by similar changes in the temperature of the other transistor, a load resistance connected between the collector of said one transistor and its supply pole, a coupling connection from the circuit of said load resistance to the base of the next transistor for impressing thereon the output of said one transistor developed across said load resistance, an emitter resistance connected between the emitter of said one transistor and its respective supply pole, and a direct-current connection from the base of the next transistor to said emitter resistance and the emitter of said one transistor for causing a change in the emitter current of said one transistor by changes in its temperature to modify the basis applied through the last-named direct-current connection to the base of the next transistor and thereby minimize changes in the emitter current in said next transistor under said temperature changes.

References Cited in the file of this patent

UNITED STATES PATENTS

| | | |
|---|---|---|
| 2,680,160 | Yaeger | June 1, 1954 |
| 2,801,296 | Blecher | July 30, 1957 |

OTHER REFERENCES

Bell Telephone Text: "The transistor," page 373, Fig. 16, published by the Bell Telephone Lab. Inc.

Text: "Principles of Transistor Circuit," by Shea, published by John Wiley & Sons, Inc., Fig. 8.1, page 164, Sept. 15, 1953.